United States Patent [19]
Lockwood

[11] 3,938,172
[45] Feb. 10, 1976

[54] SEMICONDUCTOR INJECTION LASER

[75] Inventor: Harry Francis Lockwood, New York, N.Y.

[73] Assignee: RCA Corporation, New York, N.Y.

[22] Filed: May 22, 1974

[21] Appl. No.: 472,292

[52] U.S. Cl. .................. 357/18; 357/16; 357/17
[51] Int. Cl.² ............... H01S 33/00; H01L 29/161
[58] Field of Search ....................... 357/18, 17, 16

[56] References Cited
UNITED STATES PATENTS

| | | | |
|---|---|---|---|
| 3,757,174 | 9/1973 | Shigemasa | 317/235 R |
| 3,855,607 | 12/1974 | Kressel et al. | 357/18 |

*Primary Examiner*—Martin H. Edlow
*Attorney, Agent, or Firm*—Glenn H. Bruestle; Donald S. Cohen

[57] ABSTRACT

A body of single crystalline semiconductor material having spaced opposed end surfaces which form a Fabry-Perot cavity. The body includes four contiguous regions of alternating conductivity type forming three PN junctions which extend between the end surfaces of the body. Along one of the PN junctions at least a portion of at least one of the regions is a recombination zone where light is generated upon the recombination of oppositely charged carriers when the PN junctions are forwardly biased to inject one type of charged carriers into the recombination zone. Along at least one side of the recombination zone is a zone having an index of refraction lower than the index of refraction of the recombination zone to confine light in the recombination zone. Also, along one side of the recombination zone is a zone which confines the injected charged carriers in the recombination zone.

11 Claims, 8 Drawing Figures

SEMICONDUCTOR INJECTION LASER

BACKGROUND OF THE INVENTION

The present invention relates to a semiconductor injection laser, and, particularly to a high efficiency, self-pulsing semiconductor injection laser which can be simply pulsed with very short width pulses.

Semiconductor injection lasers, in general are bodies of a single crystalline semiconductor material which, when biased, emit light, either visible or infrared, through the recombination of pairs of oppositely charged carriers. Such devices generally include regions of opposite conductivity type forming a PN junction therebetween. When the junction is properly biased, charge carriers of one type are injected from one of the regions into the other where the predominant charge carriers are of the opposite type so as to achieve the light generating recombination.

To provide a semiconductor injection laser which is capable of efficient emission of stimulated radiation at room temperature, various structures have been devised which include an optically confining cavity between regions of opposite conductivity type in which the generation of radiation by the recombination of the charge carriers occurs. The cavity is generally a narrow region extending across the semiconductor body between the ends and side edges of the body. Optical confinement is usually achieved by making the regions of the body on each side of the cavity of a material having an index of refraction lower than that of the material of the cavity. At least one end edge of the body is made partially transmitting so as to form a Fabry-Perot cavity. Thus, the radiation generated in the optically confining cavity is emitted from the partially transmitting end edge of the body as a beam of coherent radiation. Some structures of semiconductor injection lasers having optically confining cavities are described in the articles "Close-Confinement Gallium Arsenide PN Junction Lasers with Reduced Optical Loss at Room Temperature," by H. Kressel et al, RCA REVIEW, Volume 30, No. 1, pages 106–113, March, 1969, "High-Order Transverse Cavity Modes in Heterojunction Diode Lasers" by J. Butler et al., APPLIED PHYSICS LETTERS, Volume 17, No. 9, Nov. 1, 1970, pages 403–406, and "An Efficient Large Optical Cavity Injection Laser" by H. F. Lockwood et al., APPLIED PHYSICS LETTERS, Volume 17, No. 12, Dec. 1, 1970, pages 499–502.

For certain types of uses, such as laser communications, it is desirable to operate the semiconductor injection laser with very short width pulses, e.g., pulse widths of 4 nanoseconds or less. However, to so operate previously known types of the semiconductor injection lasers requires expensive and complicated current drivers.

There has been developed a semiconductor light emitting diode which includes internal means for switching the diode off and on with the application of a small voltage. This type of diode is of a PNPN structure and is described in the article entitled, "Electroluminescent Shockley Diodes in GaAs and $GaAs_{1-x}P_x$" by C. J. Nuese et al., *Journal of Electronic Materials*, Vol. 2, pages 571–599, November, 1973, and U.S. Pat. No. 3,757,174 issued Sept. 4, 1973 to J. Shigemasu et al., entitled "Light Emitting-Four Layer Semiconductor Device." However, I have found that merely to provide such a PNPN light emitting diode with a laser cavity or to apply the concept of the PNPN light emitting diode to a semiconductor injection laser of the types described in the above cited articles does not necessarily result in an operative semiconductor injection laser.

SUMMARY OF THE INVENTION

A semiconductor laser including a body of semiconductor material having a pair of spaced opposed end surfaces forming a Fabry-Perot cavity. The body includes four contiguous regions extending between the end surfaces with each region being of a conductivity type opposite to that of the adjacent regions so as to provide three spaced PN junctions extending between the end surfaces of the body. At least a portion of at least one of the regions is a recombination zone where light is generated upon the recombination of oppositely charged carriers when the PN junctions arre forwardly biased to inject one type of charge carriers into the recombination zone. The body includes means extending along at least one side of the recombination zone for confining a portion of the generated light in the recombination zone and means extending along one side of the recombination zone for containing the injected charge carriers in the recombination zone.

DETAILED DESCRIPTION

Figure 1:
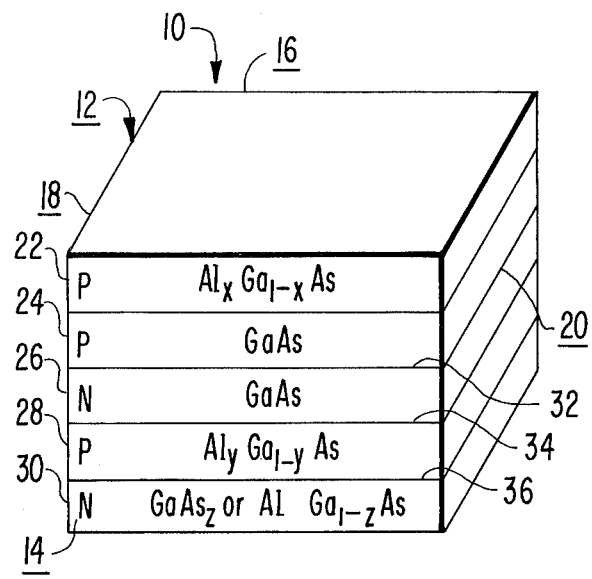
FIG. 1 is a perspective view of one form of the semiconductor injection laser of the present invention.

Referring initially to FIG. 1, one form of the semiconductor injection laser of the present invention is generally designated as 10. The semiconductor injection laser 10 is a body 12 of single crystalline semiconductor material in the form of a rectangular parallelepiped. The body 12 is formed into a Fabry-Perot cavity by making a pair of opposite side edge surfaces 14 and 16 and one end surface 18 reflective and the other end surface 20 partially transparent. Also, the opposed end surfaces 18 and 20 are preferably flat and parallel.

The body 12 is formed of five contiguous, superimposed layers 22, 24, 26, 28 and 30 extending between the end surfaces 18 and 20. The first and second layers 22 and 24 are of P type conductivity, the third layer 26 of N type conductivity, the fourth layer 28 of P type conductivity and the fifth layer 30 of N type conductivity. Thus, the body 12 includes four contiguous regions of alternating opposite conductivity type with one of the regions including the first and second layers 22 and 24 and each of the other regions including only a single layer. The four regions of alternating conductivity type provide the body 12 with a first PN junction 32 between the second and third layers 24 and 26, a second PN junction 34 between the third and fourth layers 26 and 28 and a third PN junction 36 between the fourth and fifth layers 28 and 30. The three PN junctions 32, 34 and 36 are parallel and extend between the end surfaces 18 and 20 of the body 12.

The first layer 22 and the fourth layer 28 are of a semiconductor material having a band gap energy higher than the band gap energy of the semiconductor material of the second layer 24 and third layer 26. The second and third layers 24 and 26 are of the same semiconductor material. For example, if the second and third layers 24 and 26 are of gallium arsenide, the first layer 22 may be of aluminum gallium arsenide ($Al_xGa_{1-x}As$ where $x$ is greater than 0 but less than 1), and the fourth layer 28 may be of aluminum gallium arsenide ($Al_yGa_{1-y}As$ where $y$ is greater than 0 but less than 1). It is well known that aluminum gallium arsenide has a band gap energy greater than that of gallium arsenide. The band gap energy of aluminum gallium arsenide can be varied by varying the amount of aluminum in the compound. The first layer 24 and the fourth layer 28 may contain the same amount of aluminum so as to have the same band gap energy or may contain different amounts of aluminum so as to have different band gap energies. The composition of the semiconductor material of the fifth layer 30 is not critical, but is preferably of one of the materials used for the other layers. Thus, if the second and third layers 24 and 26 are of gallium arsenide and the first and fourth layers 22 and 28 are of aluminum gallium arsenide, the fifth layer 30 may be of either gallium arsenide or aluminum gallium arsenide ($Al_zGa_{1-z}As$ where $z$ is greater than 0 but less than 1).

The semiconductor injection laser 10 may be made by epitaxially depositing five layers of the proper conductivity type and composition in succession on a substrate. The layers may be deposited either starting with the first layer 22 of P type aluminum gallium arsenide or with the fifth layer 30 of N type gallium arsenide or aluminum gallium arsenide. The epitaxial layers can be deposited by liquid phase epitaxy such as described in U.S. Pat. No. 3,741,825 to H. F. Lockwood et al., issued June 26, 1973, and entitled, "Method of Depositing an Epitaxial Semiconductor Layer from the Liquid Phase." After the five layers are deposited, the substrate may be removed, or, if the substrate is of a high conductivity material, it can be retained as a contact for the adjacent layer of the semiconductor injection laser 10.

In the use of the semiconductor injection laser 10, a DC voltage is applied across the laser such that the first layer 22 is positive with respect to the fifth layer 30. If the voltage applied is low, the first and third PN junctions 32 and 36 are forward biased while the second PN junction 34 is reverse biased. With the second PN junction 34 reverse biased, no current flows across the semiconductor injection laser 10 and it is in its "off" state. However, when the voltage is increased so as to exceed a breakover voltage, there is sufficient gain in the semiconductor injection laser 10 to cause the normally reverse biased second PN junction 34 to become forward biased. When all three of the PN junctions 32, 34, and 36 become forward biased, the total impedance in the semiconductor injection laser 10 turns from high to low to allow a flow of current through the semiconductor injection laser 10.

The flow of current through the semiconductor injection laser 10 causes a flow of minority carriers across the first PN junction 32 from one of the second or third layers to the other. These minority charge carriers recombine with the charge carriers of the opposite type in either the second or third layer to generate light. Thus, the second layer 24 and/or the third layer 26 form a recombination zone where light is generated by the recombination of oppositely charged carriers.

Since the first layer 22 and the fourth layer 28 have a band gap energy higher than that of the second and third layers 24 and 26, they have an index of refraction lower than that of the second and third layers 24 and 26. This difference in index of refraction confines in the recombination zone most of the light generated therein and provides an optical waveguide for the generated light. Since the optical waveguide is within a Fabry-Perot cavity, the light generated in the recombination zone is emitted from the partially transparent end surface 20 of the semiconductor injection laser 10 as a substantially coherent beam of light. The first layer 22 being of a higher band gap energy than that of the second layer 24 but of the same conductivity type as the second layer 24, serves to confine the flow of free carriers in the second layer 24, which is a part of the recombination zone. This confinement of the free carriers to the recombination zone causes a higher efficiency of the generation of light in the recombination zone which is essential to achieve lasing.

Figure 8:
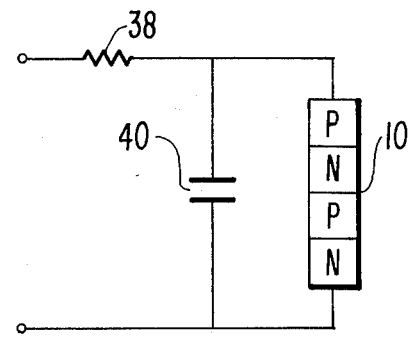
FIG. 8 is a circuit diagram of an operating circuit for the semiconductor injection laser of the present invention.

The semiconductor injection laser 10 is capable of being operated in a very simple circuit with very short width pulses. In FIG. 8, there is shown an example of one such circuit. In this circuit, the semiconductor injection laser 10 is connected across a DC voltage source in series with a resistor 38. A capacitor 40 is in parallel with the semiconductor injection laser 10 and in series with the resistor 38. When the voltage across the semiconductor injection laser 10 is below the breakover voltage, the semiconductor injection laser 10 is in its "off" condition and very little current flows thereacross. Under this condition, a charge is built up across the capacitor 40. When the voltage across the semiconductor injection laser 10 increases to the breakdown voltage, the semiconductor injection laser 10 switches to its "on" condition under which condition the total impedance in the semiconductor injection laser 10 turns from high to low. This allows the capacitor 40 to discharge across the semiconductor injection laser 10 providing a high current flow through the semiconductor injection laser 10. This flow of current generates light in the semiconductor injection laser 10 which is emitted as a substantially coherent beam of light in the manner previously described. As the capacitor 40 discharges, the current flow across the semiconductor injection laser 10 decreases until the semiconductor injection laser 10 switches back to its "off" condition. The voltage then again begins to build up to repeat the process of switching the semiconductor injection laser between its "off" and "on" condition to provide pulses of light from the semiconductor injection laser. Thus, the circuit provides relaxation oscillations having a frequency which is determined by the time to charge and discharge the capacitor 40. This circuit has been found to provide pulse widths of as low as 2 nanoseconds.

Figure 2:
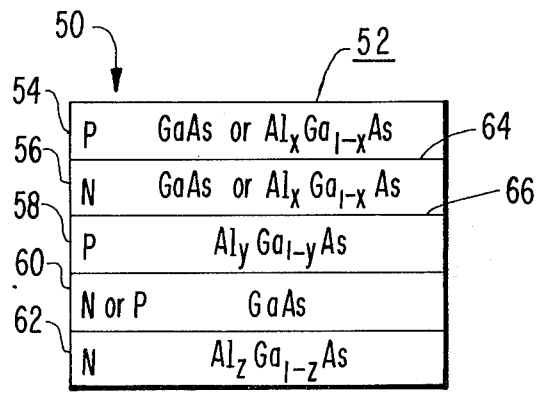
FIGS. 2 through 7 are each a sectional view of a different modification of the semiconductor injection laser of the present invention.

Referring to FIG. 2, a modification of the semiconductor injection laser of the present invention is generally designated as 50. The semiconductor injection laser 50, like the semiconductor injection laser 10 shown in FIG. 1, is a body 52 of single crystalline semiconductor material in the form of a rectangular parallelepiped which is formed into a Fabry-Perot cavity. The body 52 is formed of five contiguous, superimposed layers 54, 56, 58, 60 and 62 extending between the end surfaces of the body. The first and third layers 54 and 58 are of P type conductivity, the second and fifth layers 56 and 62 are of N type conductivity and the fourth layer 60 may be of either N or P type conductivity. Thus, the body 52 includes four contiguous regions of alternating opposite conductivity type with the first layer 54, the second layer 56, the third layer 58 and the fifth layer 62 each being in a separate one of the regions. The fourth layer 60 is in the same region as either the third layer 58 or the fifth layer 62 depending on whether the fourth layer 60 is of P or N type conductivity. The four regions of alternating conductivity type provide the body 52 with a first PN junction 64 between the first and second layers 54 and 56 and a second PN junction 66 between the second and third layers 56 and 58. There is also a third PN junction which is either between the third and fourth layers 58 and 60 or between the fourth and fifth layers 60 and 62 depending on the particular conductivity type of the fourth layer 60.

The third layer 58 and fifth layer 62 are of a semiconductor material having a band gap energy higher than the band gap energy of the semiconductor material of the fourth layer 60. For example, if the fourth layer 60 is of gallium arsenide, the third layer 58 and fifth layer 62 may be each of aluminum gallium arsenide. The first and second layers 54 and 56 are preferably of one of the materials used for the other layers, e.g., gallium arsenide or aluminum gallium arsenide. The semiconductor injection laser 50 may be made in the same manner as previously described with regard to the semiconductor injection laser 10 shown in FIG. 1.

The semiconductor injection laser 50 is operated in the same manner as previously described with regard to the semiconductor injection laser 10 shown in FIG. 1. When the voltage across the semiconductor injection laser 50 is high enough to switch the semiconductor injection laser 50 to its "on" state, the current through the semiconductor injection laser 50 will cause the flow of minority carriers across the third PN junction, i.e., the junction between either the third layer 58 and fourth layer 60 or the junction between the fourth layer 60 and the fifth layer 62 depending on the conductivity type of the fourth layer, into the fourth layer 60. These minority charge carriers recombine with the charge carriers of the opposite type in the fourth layer 60 to generate light. Thus, the fourth layer 60 forms a recombination zone where light is generated by the recombination of oppositely charged carriers.

Since the third layer 58 and fifth layer 62 have a band gap energy higher than that of the fourth layer 60, they have an index of refraction lower than that of the fourth layer 60. This confines in the recombination zone most of the light generated therein and provides an optical waveguide for the generated light. Since the optical waveguide is within a Fabry-Perot cavity, the light generated in the recombination zone is emitted from the end surface of the semiconductor injection laser 50 which is partially transparent.

If the fourth layer 60 is of P type conductivity, the minority carriers which are injected into the fourth layer 60 will be electrons. Since the third layer 58 is of P type conductivity and of a material having a band gap energy higher than the material of the fourth layer 60, the third layer 58 will confine these minority carriers in the fourth layer 60. If the fourth layer 60 is of N type conductivity, the minority carriers injected into the fourth layer 60 will be holes. Since the fifth layer 62 is of N type conductivity and of a material having a band gap energy higher than that of the material of the fourth layer 60, the fifth layer 62 will confine the flow of these minority carriers to the fourth layer 60. Thus, either the third layer 58 or the fifth layer 62, depending on the conductivity type of the fourth layer 60, will also serve to confine the flow of free carriers to the recombination zone to achieve a higher efficiency of the generation of light in the recombination zone.

Figure 3:
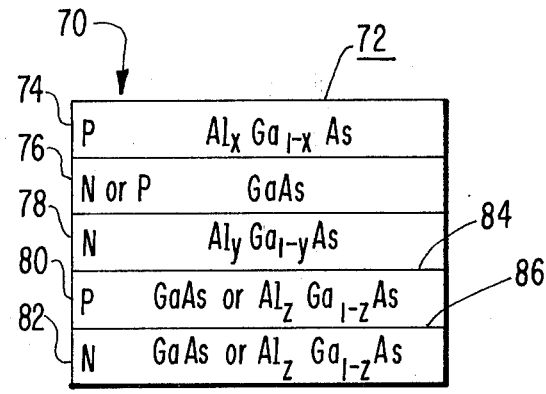

Referring to FIG. 3, a second modification of the semiconductor injection laser of the present invention is generally designated as 70. The semiconductor injection laser 70 also is a body 72 of single crystalline semiconductor material in the form of a rectangular parallelepiped which is formed into a Fabry-Perot cavity. The body 72 is formed of five contiguous, superimposed layers 74, 76, 78, 80 and 82 extending between the end surfaces of the body 72. The first layer 74 and the fourth layer 80 are of P type conductivity, the third layer 78 and fifth layer 82 are of N type conductivity and the second layer 76 is of either N or P type conductivity. Thus, the body 72 includes four contiguous regions of alternating opposite conductivity type with the first layer 74, third layer 78, fourth layer 80 and fifth layer 82 each forming a separate one of the regions. The second layer 76 is in the same region as either the first layer 74 or third layer 78 depending on the conductivity type of the second layer 76. The four regions of alternating conductivity type provide the body 72 with three PN junctions extending between the end surfaces of the body. The first PN junction is either between the first layer 74 and the second layer 76 or between the second layer 76 and the third layer 78, depending on the conductivity type of the second layer 76. The second PN junction 84 is between the third layer 78 and the fourth layer 80 and the third PN junction 86 is between the fourth layer 80 and the fifth layer 82.

The first layer 74 and the third layer 78 are each of a semiconductor material having a band gap energy higher than the material of the second layer 76. For example, if the second layer 76 is of gallium arsenide, the first layer 74 and the third layer 78 each may be of aluminum gallium arsenide. The fourth layer 80 and fifth layer 82 are preferably of one of the materials used for the other layers, e.g., gallium arsenide or aluminum gallium arsenide.

The semiconductor injection laser 70 may be made in the same manner as previously described with regard to the semiconductor injection laser 10 shown in FIG. 1. The semiconductor injection laser 70 operates in the same manner as previously described with regard to the semiconductor injection laser 50 shown in FIG. 2. However, in the semiconductor injection laser 70, the second layer 76 is the recombination zone into which the minority charge carriers are injected from either the first layer 74 or the third layer 78 to cause the generation of light in the second layer 76. The first layer 74 and third layer 78 serve to confine the light generated in the second layer 76 because of the difference of the indices of refraction of the materials of the first and third layers 74 and 78 and the material of the second layer 76. The first layer 74 or the third layer 78, depending on the conductivity type of the second layer 76, also serves to confine the flow of free carriers to the recombination zone formed by the second layer 76.

Figure 4:
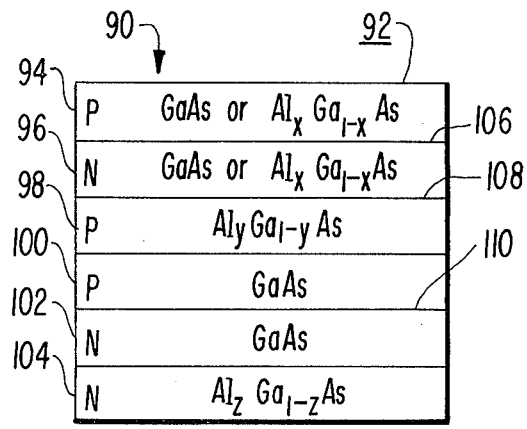

Referring to FIG. 4, a third modification of the semiconductor injection laser of the present invention is generally designated as 90. The semiconductor injection laser 90 is a body 92 of single crystalline semiconductor material in the form of a rectangular parallelepiped which is formed into a Fabry-Perot cavity. The body 92 is formed of six contiguous, superimposed layers 94, 96, 98, 100, 102, and 104 extending between the end surfaces of the body. The first, third and fourth layers 94, 98 and 100 are of P type conductivity, and the second, fifth and sixth layers 96, 102 and 104 are of N type conductivity. Thus, the body 92 includes four contiguous regions of alternating opposite conductivity type with the first layer 94 being one region, the second layer 96 being the second region, the third and fourth layers 98 and 100 being the third region and the fifth and sixth layers 102 and 104 being the fourth region. The four regions of alternating conductivity type provide the body 92 with a first PN junction 106 between the first layer 94 and the second layer 96, a second PN junction 108 between the second layer 96 and the third layer 98 and a third PN junction 110 between the fourth layer 100 and the fifth layer 102.

The third layer 98 and the sixth layer 104 are of a material having a band gap energy higher than the band gap energy of the material of the fourth and fifth layers 100 and 102 which are of the same material. For example, if the fourth and fifth layers 100 and 102 are of gallium arsenide, the third and sixth layers 98 and 104 can be of aluminum gallium arsenide. The first and second layers 94 and 96 are preferably of one of the materials used for the other layers, e.g., gallium arsenide or aluminum gallium arsenide. The semiconductor injection laser 90 may be made in the same manner as previously described with regard to the semiconductor injection laser 10 shown in FIG. 1.

The semiconductor injection laser 90 is operated in the same manner as previously described with regard to the semiconductor injection laser 10 shown in FIG. 1. However, when the semiconductor injection laser 90 is in its "on" state, the fourth and fifth layers 100 and 102 form the recombination zone where light is generated by the recombination of oppositely charged carriers. The third and sixth layers 98 and 104, which are of a material having a band gap energy higher than the material of the fourth and fifth layers 100 and 102, serve to confine the generated light to the recombination zone. The third layer 98 or the sixth layer 104 also serves to confine the free carriers which are injected into the recombination zone, depending on the type of free carriers which are so injected.

Figure 5:
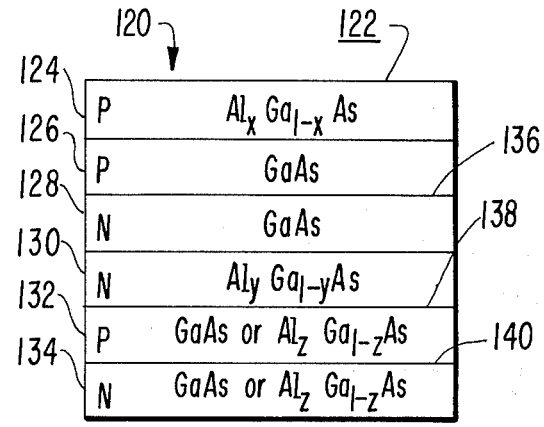

Referring to FIG. 5, a fourth modification of the semiconductor injection laser of the present invention is generally designated as 120. The semiconductor injection laser 120 is a body 122 of single crystalline semiconductor material in the form of a rectangular parallelepiped which is formed into a Fabry-Perot cavity. The body 122 is formed of six contiguous, superimposed layers 124, 126, 128, 130, 132 nd 134 extending between the end surfaces of the body. The first, second and fifth layers 124, 126 and 132 are of P type conductivity and the third, fourth and sixth layers 128, 130 and 134 are of N type conductivity. Thus, the body 122 includes four contiguous regions of alternating opposite conductivity type with the first and second layers 124 and 126 being one region, the third and fourth layers 128 and 130 being a second region, the fifth layer 132 being the third region and the sixth layer 134 being the fourth region. The four regions of alternating conductivity type provide the body 122 with a first PN junction 136 between the second layer 126 and the third layer 128, a second PN junction 138 between the fourth layer 130 and the fifth layer 132, and a third PN junction 140 between the fifth layer 132 and the sixth layer 134.

The first and fourth layers 124 and 130 are of a semiconductor material having a band gap energy higher than the band gap energy of the semiconductive material of the second and third layers 128 and 130, which are of the same semiconductor material. For example, if the second and third layers 126 and 128 are of gallium arsenide, the first and fourth layers 124 and 130 may be of aluminum gallium arsenide. The fifth and sixth layers 132 and 134 are preferably of one of the materials used for the other layers, e.g., gallium arsenide or aluminum gallium arsenide.

The semiconductor injection laser 120 may be made in the same manner as previously described with regard to the semiconductor injection laser 10 shown in FIG. 1. The semiconductor injection laser 120 operates in the same manner as previously described with regard to the semiconductor injection laser 90 shown in FIG. 4. However, in the semiconductor injection laser 120, the second and third layers 126 and 128 form the recombination zone into which the minority charge carriers are injected to cause the generation of light. The first layer 124 and the fourth layer 130 serve to combine the light generated in the recombination zone because of the difference in the indices of refraction of the materials. The first layer 124 or the fourth layer 130 also serves to confine the flow of free carriers to the recombination zone depending on which type of free carriers are being injected into the recombination zone.

Figure 6:
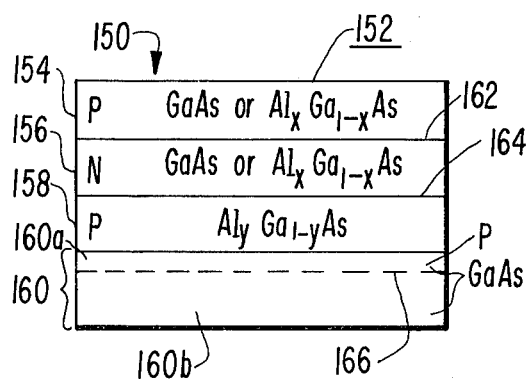

Referring to FIG. 6, a fifth modification of the semiconductor injection laser of the present invention is generally designated as 150. The semiconductor injection laser 150 also is a body 152 of single crystalline semiconductor material in the form of a rectangular parallelepiped which is formed into a Fabry-Perot cavity. The body 152 is formed of four contiguous, superimposed layers 154, 156, 158 and 160. The first and third layers 154 and 158 are of P type conductivity and the second layer 156 is of N type conductivity. The fourth layer 160 has a thin portion 160a of P type conductivity which extends along the junction with the third layer 158. The remaining portion 160b of the fourth layer 160 is of N type conductivity. Thus, the body 152 includes four contiguous regions of alternating opposite conductivity type with the first layer 154 being one region, the second layer 156 being the second region, the third layer 158 and the P type portion 160a of the fourth layer 160 being the third region, and the N type portion 160b of the fourth layer 160 being the fourth region. The four regions of alternating conductivity type provide the body 152 with a first PN junction 162 between the first and second layers 154 and 156, a second PN junction 164 between the second and third layers 156 and 158 and a third PN junction 166 between the two portions 160a and 160b of the fourth layer 160.

The third layer 150a is of a semiconductor material having a band gap energy higher than the material of the fourth layer 160. For example, if the fourth layer 160 is of gallium arsenide, the third layer 158 may be of aluminum gallium arsenide. The first and second layers 154 and 156 are preferably of one of the materials used for the other layers, e.g., gallium arsenide or aluminum gallium arsenide.

The semiconductor injection laser 150 may be made in the same manner as previously described with regard to the semiconductor injection laser shown in FIG. 1 by epitaxially depositing the various layers in succession on a substrate. However, the thin P type portion 160a of the fourth layer 160 is formed by diffusing some of the P type conductivity modifier from the third layer 158 into a completely N type fourth layer. This may be accomplished by depositing the third layer 158 on a completely N type fourth layer at a temperature at which the diffusion will take place or by heating the unit after the P type third layer 158 is deposited on the completely N type fourth layer.

The semiconductor injection laser 150 operates in a manner similar to that described with regard to semiconductor injection laser 10 in FIG. 1. However, the semiconductor injection laser 150, the P type portion 160a of the fourth layer 160 is the recombination zone into which the minority charge carriers are injected from the N type portion 160b of the fourth layer to cause the generation of light. The third layer 158 serves to confine the light generated in the P type portion 160a of the fourth layer 160 because of the difference of the indices of refraction. The third layer 158 also serves to confine the flow of free carriers to the recombination zone formed by the P type portion 160a of the fourth layer 160.

Figure 7:
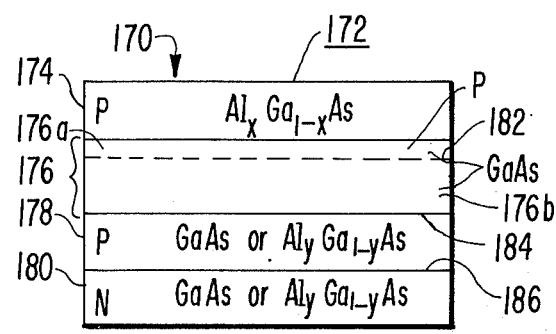

Referring to FIG. 7, a sixth modification of the semiconductor injection laser of the present invention is generally designated as 170. The semiconductor injection laser 170 is a body 172 of single crystalline semiconductor material in the form of a rectangular parallelepiped which is formed into a Fabry-Perot cavity. The body 172 is formed of four contiguous, superimposed layers 174, 176, 178 and 180 extending between the end surfaces of the body 172. The first and third layers 174 and 178 are of P type conductivity and the fourth layer 180 is of N type conductivity. The second layer 176 has a thin portion 176a of P type conductivity extending along the junction with the first layer 174. The remaining portion 176b of the second layer 176 is of N type conductivity. Thus, the body 172 includes four contiguous regions of alternating opposite conductivity type with the first layer 174 and the P type portion 176a of the second layer 176 being one region, the remaining N type portion 176b of the second layer being the second region, the third layer 178 being the third region, and the fourth layer 180 being the fourth region. The four regions of alternating conductivity type provide the body 172 with a first PN junction 182 between the two portions 176a and 176b of the second layer, a second PN junction 184 between the N type portion 176b of the second layer 176 and the third layer 178, and a third PN junction 186 between the third and fourth layers 178 and 180.

The first layer 174 is of a semiconductor material having a band gap energy higher than the material of the second layer 176. For example, if the second layer 176 is of gallium arsenide, the first layer 174 may be of aluminum gallium arsenide. The third and fourth layers 178 and 180 are preferably of one of the materials used for the other layers, e.g., gallium arsenide or aluminum gallium arsenide.

The semiconductor injection laser 170 may be made in the same manner as previously described with regard to the semiconductor injection laser 150 shown in FIG. 6. In making the semiconductor injection laser 170, the thin P type portion 176a of the second layer 176 is formed by diffusiong a P type conductivity modifier from the first layer 174.

The semiconductor injection laser 170 operates in the same manner as previously described with regard to the semiconductor injection laser 150 shown in FIG. 6. However, in the semiconductor injection laser 170, the thin P type portion 176a of the second layer 176 is the recombination zone into which the minority charge carriers are injected from the N type portion 176b of the second layer 176 to cause the generation of light. The first layer 174 serves to confine the light generated in the recombination zone because of the difference of the indices of refraction of the materials. The first layer 174 also serves to confine the flow of free carriers to the recombination zone.

Thus, the semiconductor injection laser of the present invention can be of many different structures. However, all of the various modifications of the semiconductor injection laser of the present invention have the following common features:

1. A body of single crystalline semiconductor material in the form of a Fabry-Perot cavity.
2. The body includes four contiguous regions of alternating opposite conductivity type forming three spaced PN junctions.
3. A recombination zone formed by at least a portion of one of the regions wherein light is generated by the recombination of oppositely charged carriers when one of the charged carriers is injected into the recombination zone.
4. A zone along at least one side of the recombination zone for confining at least some of the generated light into the recombination zone and forming an optical waveguide for the generated light. The light confining zone is usually formed of a semiconductor material having a band gap energy higher than that of the material of the recombination zone so as to have an index of refraction lower than that of the material of the recombination zone.
5. A zone along one side of the recombination zone for confining the injected carriers in the recombination zone so as to achieve a higher efficiency of generated light. The injected carrier confining zone is of a material having a band gap energy higher than that of the material of the recombination zone and is of the same conductivity type as that of the adjacent portion of the recombination zone.

Although the various modifications of the semiconductor injection laser of the present invention have been described as being made of gallium arsenide and aluminum gallium arsenide, the semiconductor injection laser may be made of any single crystal semiconductor material which is capable of generating light by the recombination of oppositely charged carriers. However, the preferred materials are the group III–V semiconductor compounds, such as the arsenides, phosphides and antimonides of gallium, aluminum, indium or alloys thereof. Also, the zones having different band gap energies may be formed of any of these materials which are compatible and which have different band gap energies.

I claim:

1. A semiconductor injection laser comprising
   a body of semiconductor material having a pair of spaced opposed end surfaces forming a Fabry-Perot cavity, said body having four contiguous regions extending between said end surfaces with each region being of a conductivity type opposite to that of the adjacent region so as to provide three spaced PN junctions extending between said end surfaces,
   at least a portion of at least one of the regions along one of the outer PN junctions being a recombination zone where light is generated upon the recombination of oppositely charged carriers when the PN junctions are forwardly biased to inject one type of charged carriers into said recombination zone, means along at least one side of the recombination zone for confining a portion of the generated light in said recombination zone, and means along at least one side of the recombination zone for confining the injected charged carriers in said recombination zone.

2. A semiconductor injection laser in accordance with claim 1 in which the means for confining the light to the recombination zone comprises a zone of a material having an index of refraction lower than the index of refraction of the material of the recombination zone.

3. A semiconductor injection laser in accordance with claim 2 in which the means for confining the light extends along both sides of the recombination zone.

4. A semiconductor injection laser in accordance with claim 2 in which the means for confining the injected charge carriers to the recombination zone comprises a zone of a material having a band gap energy higher than the band gap energy of the material of the recombination zone and of a conductivity type the same as that of the adjacent portion of the recombination zone.

5. A semiconductor injection laser in accordance with claim 4 in which said body includes a plurality of contiguous, superimposed layers of semiconductor material which extend between said end surfaces of the body and each of said regions and zones being formed at least a portion of one or more of said layers.

6. A semiconductor injection laser in accordance with claim 5 in which said body includes five layers with two adjacent layers forming one of said regions and each of the other layers each forming a separate one of the other regions.

7. A semiconductor injection laser in accordance with claim 6 in which at least one of said layers forms the recombination zone, the two layers along each side of the recombination zone form the light confining zones, and one of the layers forming the light confining zone also forms the zone for confining the injected charge carriers.

8. A semiconductor injection laser in accordance with claim 5 in which said body includes six layers with one pair of contiguous layers forming one of said regions, a second pair of contiguous layers adjacent said one pair forming a second region and each of the other two layers forming a separate one of the other regions.

9. A semiconductor injection laser in accordance with claim 8 in which the two layers of the two pairs which are adjacent each other form the recombination zone, the other two layers of the two pairs form the light confining zones and one of the other two layers of the two pairs forms the zone for confining the injected charge carriers.

10. A semiconductor injection laser in accordance with claim 5 in which said body includes four layers with one of said layers and a thin portion of an adjacent layer forming one of said regions, the remaining portion of said adjacent layer forming a second region and each of the other layers forming a separate one of the other regions.

11. A semiconductor injection laser in accordance with claim 10 in which the thin portion of the adjacent layer forms the recombination zone and the one layer forms the light confining zone and the injected charge carrier confining zone.

* * * * *